United States Patent [19]

Grummer et al.

[11] 4,233,522
[45] Nov. 11, 1980

[54] CAPACITIVE TOUCH SWITCH ARRAY

[75] Inventors: William L. Grummer, Cheshire; Hendrik B. Hendriks, Becket, both of Mass.

[73] Assignee: General Electric Company, Schenectady, N.Y.

[21] Appl. No.: 956,278

[22] Filed: Oct. 30, 1978

[51] Int. Cl.$^2$ .............................. H01H 35/00
[52] U.S. Cl. .......................... 307/116; 340/365 C
[58] Field of Search ............... 307/116; 200/DIG. 1; 340/365 C; 361/181, 280; 331/65

[56] References Cited

U.S. PATENT DOCUMENTS

| 3,382,588 | 5/1968 | Serrell et al. ............................. 35/9 |
| 3,492,440 | 1/1970 | Cerbone et al. ....................... 179/90 |
| 3,691,555 | 9/1972 | Looschen .............................. 340/365 |
| 3,886,539 | 5/1975 | Gould, Jr. ........................ 307/116 X |
| 3,921,167 | 11/1975 | Fox ................................. 340/365 C |

OTHER PUBLICATIONS

American Microsystems Inc., Application Note, "Touch Control Circuits for Capacitance Switching".

Primary Examiner—L. T. Hix
Assistant Examiner—W. J. Brady
Attorney, Agent, or Firm—Francis K. Richwine; Marvin A. Goldenberg

[57] ABSTRACT

A capacitive touch panel comprising an array of touch sensitive switch cells, the panel including relatively small area touch switch elements located on closely spaced centers, that can be of transparent construction particularly suited for use with data processing equipment and electronic displays. Each switch cell includes a first and a second pair of series connected capacitors energized by a common signal source, the array of switch cells being arranged so that the first pair of capacitors are connected in first groups of switch cells, such as rows, to a corresponding first plurality of signal detectors, and the second pair of capacitors are connected in second groups of switch cells, such as columns, to a corresponding second plurality of signal detectors, the junctions of each pair of capacitors of a single switch cell being selectively coupled to ground by the body or other touch capacitive means for actuating a selected switch cell.

22 Claims, 11 Drawing Figures

TO COLUMN VOLTAGE DIVIDER CAPACITORS AND COLUMN DETECTION CIRCUITS

CAPACITIVE TOUCH SWITCH ARRAY

BACKGROUND OF THE INVENTION

The invention pertains generally to the field of touch operated switch devices used to provide the interface between a human operator and data processing equipment, and has particular relevance to capacitive touch sensitive switch arrays that are employed for this purpose.

In present day practice, the most common manner of entering information into data processing equipment is through a mechanical keyboard composed of push button switches. These arrangements have numerous disadvantages normally associated with mechanical switches, such as requiring a large number of moving parts that are subject to wear, and exhibiting a relatively slow operation. In addition, since they are necessarily of an opaque and bulky construction, mechanical keyboards cannot be employed to interact directly with a computer display and their usefulness is accordingly limited.

A number of electronic computer interface systems have been developed which can be fabricated in a totally transparent or partially transparent form and which overcome many limitations of mechanical switches. These include optical, acoustical and capacitive systems. Optical and acoustical systems, which involve the interruption of light beams or acoustic waves by the finger, stylus or other such means, while being adaptable to interact with display screens of various forms and possessing a high information density capability, are relatively expensive and cumbersome structures. They also normally require a high degree of precision for their operation. For example, in the two more common systems of this type, the light pen and sonic digitizer, each require use of a hand held "pen" or stylus normally connected by cable to the electronics circuitry that must be positioned in a specific orientation to the light source or microphone and therefore requires a certain skill by the user. Maintenance and reliability of operation of sonic pen systems have also proven to be a major problem because of the precise alignment required of the microphones and their susceptibility to spurious noise signals. A precise alignment of the optical sensors is also required in the light pen systems. In addition, their use is limited to light scan type display screens and cannot be used, for example, with plasma panel displays.

Capacitive touch systems are primarily of two types. In one, the switch cells each comprise a single capacitor formed of two conductive plates, usually in the shape of interacting fingers, located on a single surface of a dielectric material. The capacitor is energized from an AC signal source and is coupled to a signal detection circuit, the detected signal being a function of the capacitance which is changed in response to touch. The switch cells of the other type of capacitive touch system each comprise one pair of series connected capacitors formed of three conductive plates, two closely spaced on one surface of a dielectric material and the third plate on the opposing surface overlapping the other two plates. In this device the series connected capacitors, which are energized by an AC signal source, form a voltage divider arrangement with the stray capacitance at the input to the signal detector. Touching the third plate alters the capacitive voltage divider arrangement, thereby changing the voltage level at the detection circuit as a function of touch. Capacitive touch systems are free of many of the problems noted with respect to the optical and acoustical systems, being of relatively inexpensive construction and readily operated through touch of a finger or stylus. However, they are generally limited by plate area requirements for obtaining a high density of switch cells in a given array. In addition, the numerous interconnections usually required for multiple switch cells make it difficult to achieve a totally transparent structure. Also, variable parasitic capacitances can adversely affect the operation of these systems.

The three plate device, to which the invention more specifically relates, is capable of good signal characteristics and an effective and reliable operation when sufficient signal is capacitively coupled through the series capacitor pair of each device. Within normal system parameters, this requires some minimum value of capacitance of the series capacitors, as well as relatively small parasitic capacitive effects. Since, for a given dielectric, the series capacitor capacitance is proportional to the capacitor plate area, presently known devices have minimum area requirements that preclude their application to arrays needing a large number of entry points within the constraint of a relatively small panel surface.

In addition, parasitic capacitive effects may often subject present day capacitive switch cells to false actuation caused by stimuli other than the actual touch of an operator. Several approaches have been employed to eliminate the problem which generally use shielding techniques. However, these are rather complex and costly solutions, and may not perform completely satisfactorily in all cases.

Present day array constructions, in addition to being restricted in the density of switch cells, normally require a discrete detection circuit for each switch cell. In some arrays which have a reduced number of detection circuits, a relatively complex scanning of the AC source voltage is required. In both types of prior art arrays, nevertheless, a large number of interconnections are employed which are undesirable for fabrication of the arrays.

SUMMARY OF THE INVENTION

It is accordingly an object of the invention to provide a novel and improved capacitive touch switch array useful as the interface between a human operator and data processing equipment, exhibiting good signal transfer characteristics and wherein the switch cells of the array can be closely spaced so as to possess a high information density capability.

A further object of the invention is to provide a novel and improved array as above described wherein the switch cells of the array have relatively small area touch elements that can be placed on relatively closely spaced centers.

Another object of the invention is to provide a novel and improved capacitive touch switch array of the type above described that requires a relatively small number of connections to peripheral circuitry without increasing complexity of the circuit operation.

Another object of the invention is to provide a novel and improved capacitive touch switch array of the type above described that can be made as a totally or substantially transparent structure for providing a direct interaction with electronic displays.

A further object of the invention is to provide a novel and improved array as above described having a configuration that eliminates the need for conductor cross overs.

An object related to the one immediately proceeding is to provide a novel and improved array of conductor electrodes of solid state construction having a configuration that eliminates the need for conductor cross overs.

Another object of the invention is to provide a novel and improved capacitive touch switch array of the type above described which substantially reduces the adverse effects of parasitic capacitances and thereby improves the transfer signal characteristics of the array.

These and other objectives of the invention are accomplished in accordance with one aspect thereof by a capacitive touch panel including an array of touch sensitive switch cells, each switch cell comprising a first and second pair of series capacitors which receive a signal from a common signal source for coupling to first and second signal detection circuit means, respectively, and touch means associated with each switch cell and responsive to touch for providing capacitive coupling of the junctions of each pair of series capacitors to ground for actuating the switch cell and varying the signal coupled to said first and second signal detection circuit means.

In accordance with a further aspect of the invention, the first pair of series capacitors are connected in first groups of switch cells to a corresponding first plurality of signal detection circuits, and the second pair of series capacitors are connected in second groups of switch cells to a corresponding second plurality of signal detection circuits, said first and second groups of switch cells defining a system of coordinates, such as rows and columns, for specifying the location of each switch cell within the array.

In accordance with another aspect of the invention, the first and second pair of series capacitors and the touch means of each switch cell within the array are integrally constructed on the touch panel, the first pair of series capacitors within each group of first groups of switch cells, such as rows, being connected in parallel, and the second pair of series capacitors within each group of second groups of switch cells, such as columns, being connected in parallel, whereby the effective capacitance of each switch cell is increased over that of an individually connected switch cell by a multiple substantially equal to the number of switch cells connected in parallel within each group.

In accordance with a further aspect of the invention, the first and second pair of series capacitors of each switch cell within the array are in an electrical circuit separate from the touch panel, and the touch means are integrally constructed on the touch panel, the geometry of the touch means being thereby independent of any requirement for generating capacitance, said touch means including first and second touch elements for each switch cell, there being a first pair of series capacitors for each group of first groups of switch cells, such as rows, and a second pair of series capacitors for each group of second groups of switch cells, such as columns, the first touch elements of switch cells in each group of said first groups of switch cells being coupled together and to the junctions of corresponding first pairs of series capacitors, and the second touch elements of switch cells in each group of said second groups of switch cells being coupled together and to the junctions of corresponding second pairs of series capacitors.

In accordance with yet another aspect of the invention in which the first and second pairs of series capacitors are in an electrical circuit separate from the touch panel, for each switch cell the touch means further includes a coupling capacitor integrally constructed on the touch panel with the first touch elements in a manner that eliminates the need for conductor cross overs.

In accordance with still another aspect of the invention, a discrete capacitance is connected between the input of each signal detection circuit and ground for masking out variations in the parasitic capacitance that exists at the detection circuit inputs, and thereby improving the signal characteristic to which the detection circuits must respond.

BRIEF DESCRIPTION OF THE DRAWINGS

While the specification concludes with the claims which particularly point out and distinctly claim that subject matter which is regarded as the invention, it is believed that the invention will be more clearly understood when considering the following detailed description taken in connection with the accompanying figures of the drawing, in which:

DESCRIPTION OF THE PREFERRED EMBODIMENTS

Figure 1:
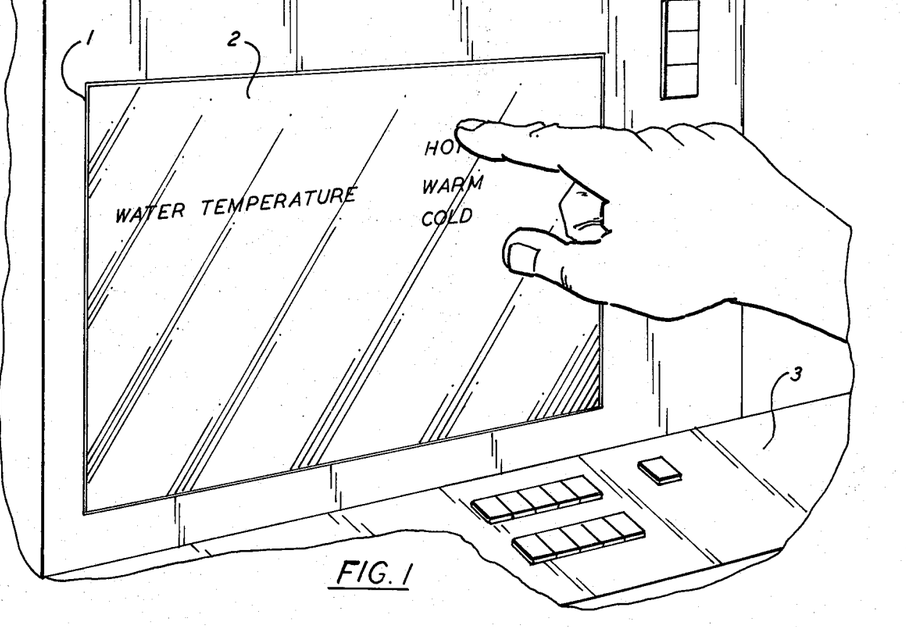
FIG. 1 is a perspective view of a capacitive touch panel overlaying an electronic display, in accordance with the invention.

With reference to FIG. 1, there is illustrated a perspective view of a capacitive touch panel 1 constructed in accordance with one of the several embodiments of the invention, which overlays an electronic display 2 and forms with the display an input-output interface with data processing equipment, now shown in FIG. 1, which may be in the form of a microprocessor, minicomputer or large computer. In the example being considered, the capacitive touch panel and electronic display are connected to a microprocessor that controls the operation of an appliance such as a washing machine 3. The electronic display 2 may be one of several different types, such as plasma panel, liquid crystal display, LED display or CRT display. The capacitive touch panel 1 is composed of an array of touch sensitive switch cells responding to the touch of the body, or other touch capacitive means such as a pen or stylus, which in accordance with the various embodiments of the invention include relatively small area touch switch elements that can be located on closely spaced centers, typically from ⅛ to ½ inch spacing, for providing a high information density capability of input signals to the computer. The capacitive touch panel must be totally or substantially transparent in order to be joined to and interact with a computer display and thereby achieve the greatest degree of freedom in its operation.

It should be clear that the illustrated capacitive touch panel and display has application to any form of equipment subject to control by data processing equipment, as well as operating solely as a touch controlled electronic display. Through interaction of the touch panel and display there is provided complete flexibility of switch functions, allowing a limitless number of functions to be added or deleted by software rather than hardware changes. Further, the close spacing of the switch element centers make possible a graphic form of display, where such display may be desirable. Although having greatest utility as a transparent structure as indicated above, for purposes of the invention the capacitive touch panel also can be made in an opaque form, not coupled to a display, and still possess significantly utility as the input interface for data processing equipment.

Figure 2:
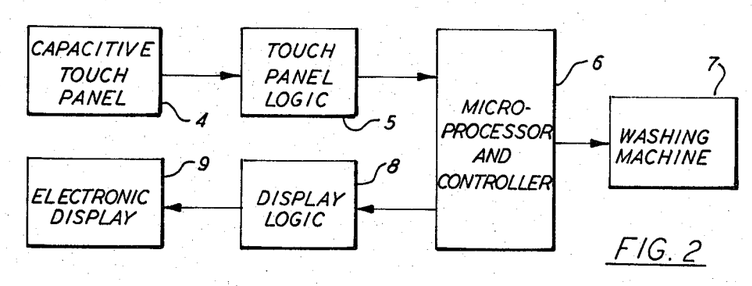
FIG. 2 is a block diagram of the inventive capacitive touch switch array in combination with a data processing system.

In FIG. 2 is a simplified block diagram of the total microprocessor system referred to with respect to FIG. 1, wherein a capacitive touch panel 4 provides input signals to a touch panel logic block 5 which may include conventional logic circuitry for providing an interface between the capacitive touch panel and a microprocessor and controller unit 6. The logic block 5 may include detection and scanning circuitry, such as found in the American Microsystems, Inc. S9263 interface circuit, conventional memory circuitry and conventional priority logic circuitry. The priority logic circuitry ensures there is processed not more than a single output information when more than a single switch cell should be actuated at one time. The microprocessor unit 6 provides control signals for controlling the operation of a given piece of equipment, which in the present example is a washing machine appliance 7, and applies output signals to a display logic block 8 that may include conventional logic circuitry for providing an interface between the microprocessor unit and an electronic display 9.

Figure 3A:
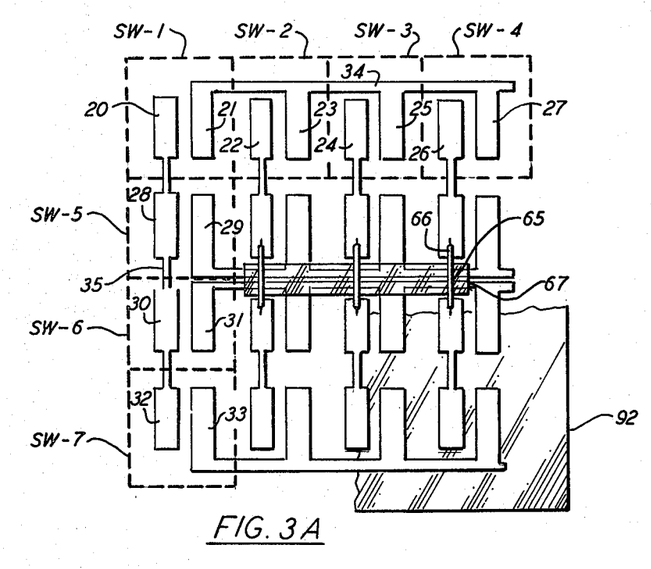
FIG. 3A is a plan view of the capacitor touch plates on the front side of a capacitor touch switch array constructed in accordance with a first embodiment of the invention.
Figure 3B:
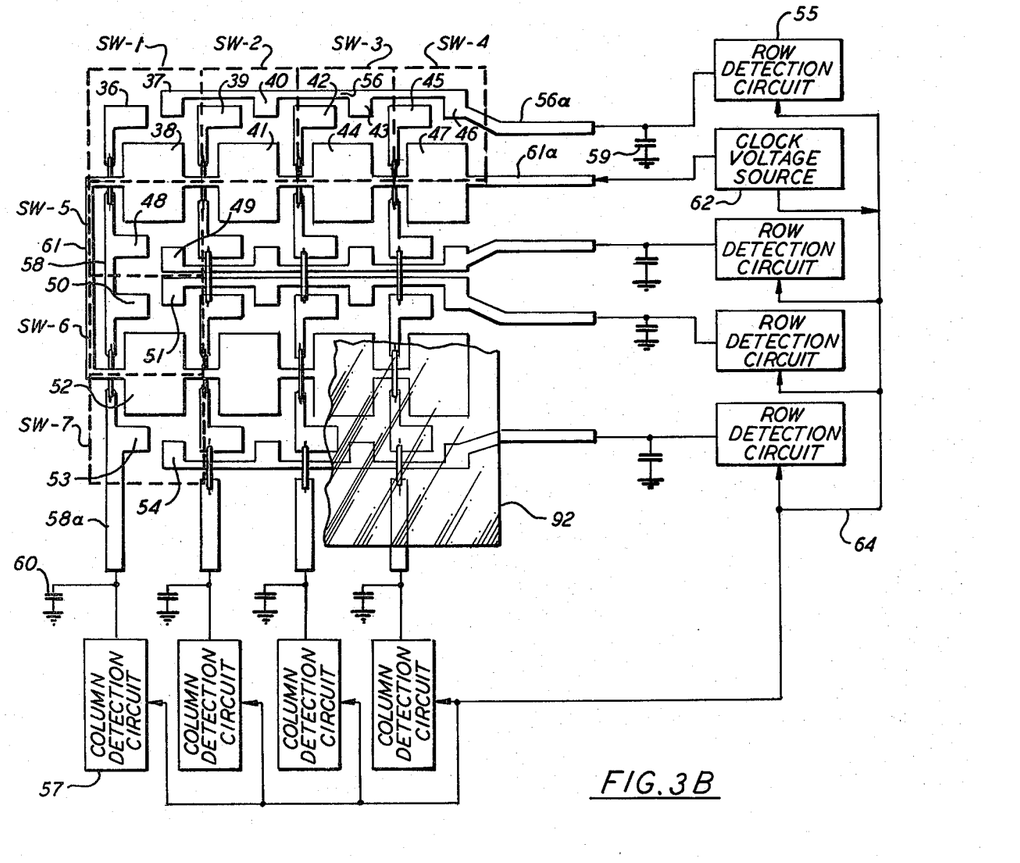
FIG. 3B is a plan view of the capacitor plates on the rear side of the first embodiment capacitor touch switch array and a block diagram of the array's peripheral signal detector and voltage source components.

Referring to FIGS. 3A and 3B, there is illustrated a capacitor touch switch array constructed in accordance with a first embodiment of the invention, such as may be employed in the system of FIG. 2. For ease of illustration the switch array is shown as a four by four matrix of four rows and four columns of touch sensitive switch cells, of which only switch cells SW-1 through SW-7 are identified. A single clock voltage source is provided for the array and a detection circuit for each row and column of switch cells, these components normally being part of conventional logic circuits contained in the touch panel logic block 5 of FIG. 2. The switch array can readily be made larger for greater utility, for example up to and exceeding a 64 by 64 matrix. Each switch cell is composed of conductor electrodes that include two capacitor touch plates on the front side of the array and three capacitor plates on the rear side of the array. Together with a layer of dielectric material 92 separating the plates on the front side from the plates on the rear side, only a portion of the dielectric layer being illustrated in FIGS. 3A and 3B, these plates form a first pair of series capacitors corresponding to a row position, and a second pair of series capacitors corresponding to a column position, illustrated as capacitors 10, 11 and 12, 13, respectively, in the electrical equivalent circuit of FIG. 4, which circuit will be discussed in greater detail subsequently.

As shown in the plan view of FIG. 3A, switch cells SW-1 through SW-7 contain on the front side, respectively, capacitor touch plates 20 and 21; 22 and 23; 24 and 25; 26 and 27; 28 and 29; 30 and 31; and 32 and 33. Capacitor touch plates 21, 23, 25 and 27 of the first row switch cells SW-1 through SW-4 are connected together by a conductor 34. Similarly, capacitor touch plates 29, 31 and 33 of switch cells SW-5, SW-6 and SW-7, respectively, are connected to corresponding capacitor touch plates of switch cells in their respective rows. Capacitor touch plates 20, 28, 30 and 32 of the first column switch cells SW-1, SW-5, SW-6 and SW-7 are connected together by conductors 35. Similarly, capacitor touch plates 22, 24 and 26 of switch cells SW-2, SW-3 and SW-4, respectively are connected to corresponding capacitor touch plates of switch cells in their respective columns.

As shown in FIG. 3B, which includes a plan view of the capacitor plates as viewed from the front side, switch cells SW-1 through SW-7 contain on the rear side, respectively, capacitor plates 36, 37, and 38; 39, 40 and 41; 42, 43 and 44; 45, 46 and 47; 48, 49 and 38; 50, 51 and 52; and 53, 54 and 52. Output capacitor plates 37, 40, 43 and 46 of the first row switch cells are connected to each other by a conductor 56 and to a first row detection circuit 55 by a terminal conductor 56a. Similarly, output capacitor plates 49, 51 and 54 of switch cells SW-5, SW-6 and SW-7, respectively, are connected to corresponding capacitor plates of switch cells in their respective rows and to the remaining row detection circuits. Output capacitor plates 36, 48, 50 and 53 of the first column switch cells are connected to each other by a conductor 58 and to a first column detector circuit 57 by a terminal conductor 58a. Similarly, output capacitor plates 39, 42 and 45 of switch cells SW-2, SW-3 and SW-4, respectively, are connected to corresponding capacitor plates of switch cells in their respective columns and to the remaining column detection circuits. Each detection circuit has a capacitor to ground connection at the input thereof, only capacitors 59 and 60 at the inputs to detector circuits 55 and 57, respectively, being identified. Input capacitor plates 38, 41, 44, 47, 52 and corresponding plates in the last two rows of switch cells are each shared by adjacent cells of a column, and are commonly connected to each other by conductors 61 and to a clock voltage source 62 by a terminal conductor 61a. The clock source 62 is further shown connected by line 64 to each of the row and column detection circuits for scanning these circuits and providing a sequential operation of these circuits. While it is convenient to employ the clock source 62 to perform the dual function of scanning and signal generation, it may be appreciated that a separate clock source may be used for the scanning function. Furthermore, although a sequential scanning operation is employed in the example under consideration, the invention contemplates addressing of the detection circuits in any well known manner for generating outputs in accordance with the state of the detection circuits addressed.

Well known materials and solid state processing techniques may be employed in the construction of the inventive capacitive touch panels herein described. For example, in a typical construction of a substantially transparent structure for the embodiment of FIGS. 3A and 3B, a glass substrate is employed as the dielectric medium 92, for example, 0.036 to 0.060 inches in thickness. A thin layer of transparent conductive material, for example a conductive oxide such as indium tin oxide having a sheet resistivity ranging from 20 to 150 ohms per square is deposited on the front and rear sides of the substrate. The material on the front side is made to form the pattern of capacitor touch plates and conductor runs shown in FIG. 3A. Similarly, the material on the rear side is made to form the pattrn of capacitor plates and conductor runs, shown in FIG. 3B. Where crossovers of conductor runs are required, such as at intersection 65 in FIG. 3A, the top conductor strip 66, which may be a conductive epoxy on the order of 20 mils wide, overlays a dielectric strip 67 running orthogonally to conductor 66 for conductor isolation. The dielectric strip 67, which may be a polyester, polyeurethane or nonconductor epoxy, is sufficiently wide to cover the underlying conductors and sufficiently thick, typically 1 mil thick, so as to minimize stray capacitance between the crossing conductors. The structure is transparent except for the narrow conductor strips that perform the cross over function, these conductors and the dielectric strips they overlay in this example being of opaque material. For a totally transparent structure, the dielectric strip may be composed of a transparent organic materials such as polymide, or a transparent inorganic material such as silicon nitride, and the crossover conductor strips may be indium tin oxide or other suitable metallic oxide.

Figure 6:
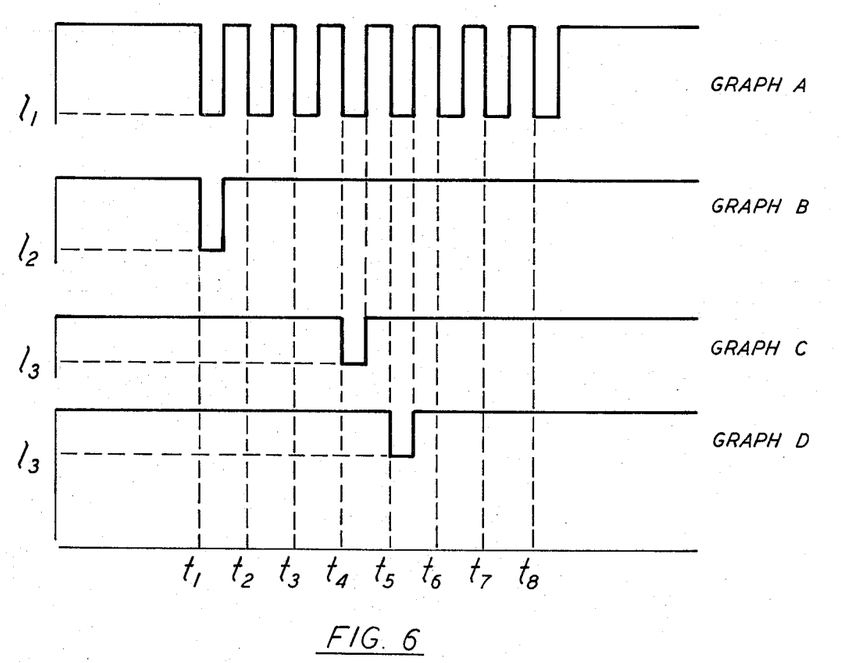
FIG. 6 is a series of graphs illustrating the pulse signals employed in describing the operation of the invention.

Considering the operation of the capacitor touch switch array of FIGS. 3A and 3B, the clock voltage from source 62 generates a pulse waveform of voltage level $l_1$, as shown in Graph A of FIG. 6, each pulse being applied in simultaneous manner to the switch cells of the array by conductors 61a and 6l. In the embodiment being considered, the pulse wave form is generated in series of eight pulses, corresponding to the total number of detection circuits. After passage through the nonactuated switch cells, the pulses are applied to the detection circuits with a voltage level of $l_2$, as shown by the single pulse at time $t_1$ in Graph B of FIG. 6. The detection circuits, which in this embodiment are conventional level detectors that generate an output as a function of the voltage level applied thereto, are scanned in a sequential manner under application of the clock so that only a single detection circuit will provide an output at one time. Upon actuation of a selected switch cell through concurrent touching of the cell's two capacitor touch plates, the voltage at the level detectors for the row and column of the selected cell is reduced to voltage level $l_3$, as shown by the sequential pulses at times $t_4$ and $t_5$ of FIG. 6, which detectors are responsive to provide an output in correspondence with the selected cell. For example, touching capacitor touch plates 20 and 21 of switch cell SW-1 causes row detection circuit 55 and column detection circuit 57 to generate an output in accordance with the scanning sequence. Likewise, touching the two capacitor plates of any of the other switch cells causes only the row and column detection circuits of such other cells to provide sequential outputs. Such outputs may be processed in a conventional manner, such as through the microprocessor and controller equipment 6 in FIG. 2, for controlling an equipment such as the washing machine 7, and for providing a display of pertinent information such as by the display means 9. It is noted that should more than a single switch cell be inadvertently actuated so as to generate outputs from several row and column detection circuits within a single scanning sequence, the priority logic circuitry in touch panel logic block 2 of FIG. 2 ensures that outputs from the row and column detection circuits of not more than a single switch cell are transmitted for processing.

Figure 4:
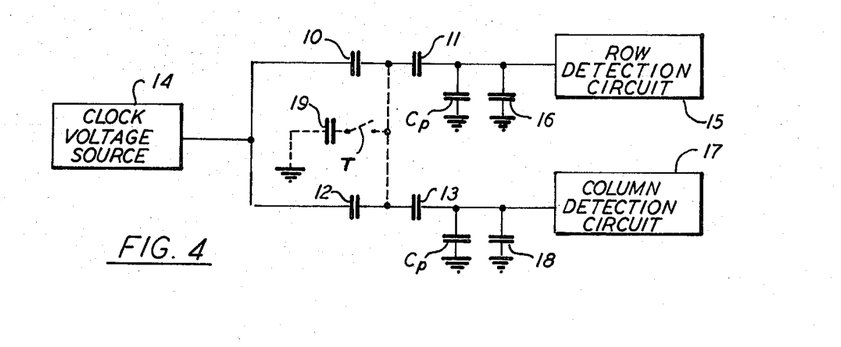
FIG. 4 is an electrical equivalent circuit of a single switch cell that is common to the first and second embodiments of the invention.

In FIG. 4 is illustrated an electrical equivalent circuit of any one of the switch cells in the array of FIGS. 3A and 3B, and also the array of FIG. 7 to be subsequently considered. Included are a first pair of series capacitors 10, 11 corresponding to a row position, and a second pair of series capacitors 12, 13 corresponding to a column position. If it is assumed that the illustrated switch cell corresponds to cell SW-1, then capacitor 10 would be formed between plates 38 and 21, capacitor 11 between plates 21 and 37, capacitor 12 between plates 38 and 20, and capacitor 13 between plates 20 and 36. A clock voltage source 14 is connected to capacitors 10 and 12 at the input of the first and second capacitor pairs. The output of the first capacitor pair is connected from capacitor 11 to a row detection circuit 15, and through the parallel connection of a capacitor $C_p$ and a capacitor 16 at the input of said detection circuit to ground. The output of the second capacitor pair is connected from capacitor 13 to a column detection circuit 17, and through the parallel connection of a capacitor $C_p$ and a capacitor 18 at the input of said detection circuit to ground. Capacitors $C_p$ represent parasitic capacitance of the circuit and capacitors 16 and 18 discrete capacitors connected in the circuit for improving circuit operation, as will be further discussed. The combination of capacitor $C_p$ with capacitor 16 corresponds to capacitor 59 in FIG. 3B, and with capacitor 18 corresponds to capacitor 60 in FIG. 3B. A capacitor 19, representing a touch capacitance of the body or stylus means, is shown connected by a broken line and a symbolic switch T between ground and the junction of capacitors 10, 11 and the junction of capacitors 12, 13. Symbolic switch T represents an opening and closing of the circuit through a touch action. As will be better appreciated when considering the equivalent circuit of FIG. 5, the present switch cell configuration allows a row and column matrix of switch cells to be addressed through a single touch action, without requiring individual detection circuits for each cell or an otherwise complex scanning arrangement with respect to the source voltage.

In the operation of the switch cell of FIG. 4, the clock voltage of voltage level $l_1$, as in Graph A of FIG. 6, is applied to the first and second capacitor pairs 10, 11, and 12, 13. Capacitors 10, 11 form a voltage divider circuit with capacitor 16 and the parasitic capacitance $C_p$ for reducing the clock voltage to voltage level $l_2$, as in Graph B of FIG. 6, which is detected by row detection circuit 15. Similarly, capacitors 12, 13 form a voltage divider circuit with capacitor 18 and the parasitic capacitance $C_p$ for reducing the clock voltage to voltage level $l_2$, which is detected by the column detection circuit 17. By closing of the switch T through a touch action and inserting the touch capacitor 19 into the circuit, an additional voltage division is provided which reduces the voltage at the input to detection circuits 15 and 17 to voltage level $l_3$, as in Graphs C and D of FIG. 6. The above operation is expressed in the following equations:

$$Vl_2 = Vl_1 \frac{C_c}{C_c + 2C_o} \quad (1)$$

$$Vl_3 = Vl_1 \frac{C_c^2}{C_c^2 + C_cC_b + C_oC_b + 2C_cC_o} \quad (2)$$

where:
$C_c$ is the capacitance of each series capacitor;
$C_o$ is the combined capacitance of the parasitic and discrete capacitance at the input to the detection circuits;
$C_b$ is the capacitance of the touch capacitor;
and $Vl_1$, $Vl_2$, $Vl_3$ are the voltages at the indicated levels of $l_1$, $l_2$ and $l_3$.

Furthermore, capacitance may be generally expressed by the following equation:

$$C = A(0.225K)/d \quad (3)$$

where:
A is the capacitor plate area;
K is the relative dielectric constant;
and d is the thickness of the dielectric material.

As seen from equations (1) and (2), in order for sufficient signal to be coupled to the detection circuits for both the actuated and non-actuated conditions of switch T, which signal in the embodiments of the invention under consideration is at a frequency of typically 100 kHz, it is necessary that $C_c$ be at least a certain minimum value. From equation (3) it is seen that for a given dielectric material, the capacitance is directly proportional to plate area and inversely proportional to dielectric thickness. In capacitive touch panel designs, the thickness of the dielectric is a relatively invariant quantity so that the magnitude of the capacitance becomes chiefly a function of the plate area. In accordance with the invention as illustrated in the first embodiment of FIGS. 3A and 3B, the capacitive touch switch array is constructed with the pairs of series capacitors in each row and each column connected in parallel. This unique connection serves to increase the effective value of $C_c$ in equations (1) and (2) by a multiple substantially equal to the number of switch cells in each row and column, which is a multiple of four in the embodiment under consideration. Accordingly, the plate area of the individual switch cells can be substantially reduced over that required for the connection of a single switch cell, thereby realizing a smaller size for each switch element while satisfying the capacitance requirements of the series capacitors for achieving good signal transfer through the switch cells and a relatively large change in signal levels sensed by the detection circuits. In addition, the referred to parallel connections result directly in a substantial reduction in the number of detection circuits required.

In an exemplary operation of the touch switch array embodiment of FIGS. 3A and 3B employing a 16 by 16 matrix of switch cells, the following circuit component values are employed in equations (1) and (2), which values are given principally for a better understanding of the invention and are not intended to be limiting thereof:

| Components | Normal Range | Typical |
|---|---|---|
| $C_c$ | 5–50 pf | 27 pf |
| $C_o$ | 1–100 pf | 20 pf |
| $C_b$ | 50–300 pf | 100 pf |
| $Vl_1$ | 12–100 v | 50 v |
| $Vl_2$ | 6–40 v | 20 v |
| $Vl_3$ | 2–10 v | 6 v |

Because of the parallel interconnection of the switch cell capacitive elements, the 27 pf capacitance for $C_c$ is achieved by providing the individual series capacitors with a capacitance of less than 2 pf.

Figure 5:
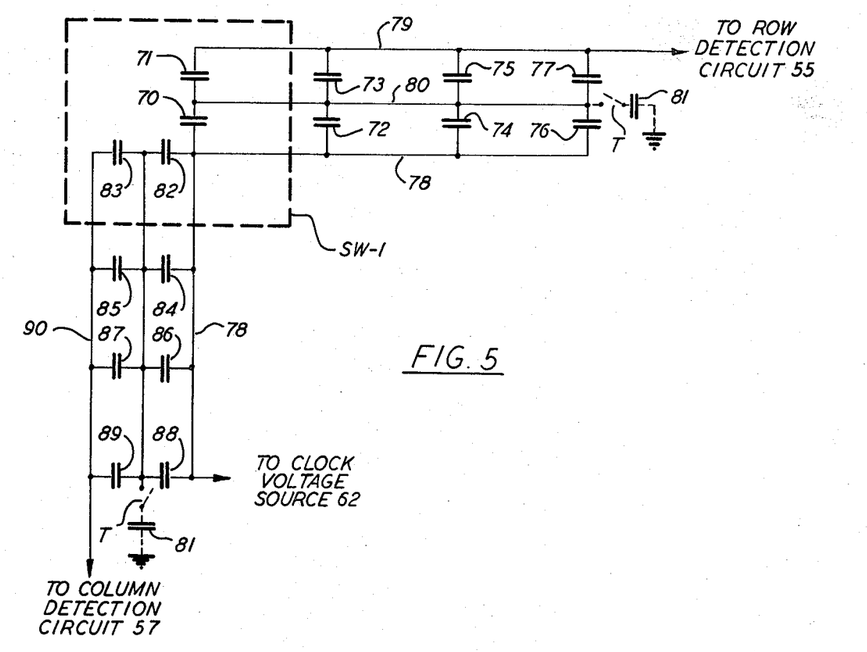
FIG. 5 is an electrical equivalent circuit of a portion of the first embodiment capacitor touch switch array.

The unique interconnection of capacitive elements is best illustrated in FIG. 5, which is the electrical equivalent circuit of a portion of the switch array of FIGS. 3A and 3B. For ease of illustration, there is shown only the row and column series capacitor pairs of switch cell SW-1 and their connection to the row series capacitor pairs of the first column switch cells. Thus, in switch cell SW-1, row series capacitors 70 and 71 are connected in series between conductor 78, which connects to the clock voltage source 62, and conductor 79, which connects to the row detection circuit 55. Row series capacitors 70 and 71, which as may be appreciated are formed by plates 38, 21 and 37 in FIGS. 3A and 3B, are further connected in parallel between conductors 78 and 79 with row series capacitor pairs 72 and 73, 74 and 75, and 76 and 77 of the remaining first row switch cells. The junction of capacitors 70 and 71 and that of the other row series capacitor pairs of the first row cells are connected together by conductor 80. This junction, which occurs at touch plate 21 of switch cell SW-1 and at the corresponding touch plates of the other first row switch cells, is coupled through a broken line symbolic switch T and touch capacitance 81 to ground.

In like manner, column series capacitors 82 and 83 of switch cell SW-1 are connected in series between conductor 78 and conductor 90, which connects to the column detection circuit 57. Column series capacitors 82 and 83, which are formed by plates 38, 20 and 36 in FIGS. 3A and 3B, are further connected in parallel between conductors 78 and 90 with column series capacitor pairs 84 and 85, 86 and 87, and 88 and 89 of the remaining first column switch cells. The junction of capacitors 82 and 83 and that of the other column series capacitor pairs of the first column cells are connected together by conductor 91. Further, this junction, which occurs at touch plate 20 of switch cell SW-1 and at the corresponding touch plates of the other first column switch cells, is coupled through a broken line symbolic switch T and touch capacitance 81 to ground.

Accordingly, when a switch cell such as switch cell SW-1 in its non-actuated state, pulses of voltage level $l_1$ from the clock voltage source are voltage divided by the parallel combination of the series capacitor pairs 70 through 77 of the first row switch cells and the capacitance to ground at the input to row detection circuit 55, not shown in FIG. 5, to provide pulses of voltage level $l_2$ at said row detection circuit input. Similarly, the parallel combination of series capacitor pairs 82 through 89 of the first column switch cells and the capacitance to ground at the input to column detection circuit 57, not shown in FIG. 5, voltage divide the applied voltage to provide pulses of voltage level $l_2$ at said column detection circuit input. When switch cell SW-1 is actuated by the simultaneous touching of touch plates 20 and 21 in FIG. 3A, which effectively closes the switches T in FIG. 5, touch capacitance 81 connects the junctions of the capacitor pairs in the first row and first column to ground. This further voltage divides the applied pulses so as to appear at the inputs to the row and column detection circuits with voltage level $l_3$.

It may be appreciated that similar connections exist between row and column capacitor pairs of all other switch cells in the array of FIGS. 3A and 3B, and the operation of the other cells is exactly as described with respect to cell SW-1.

As a further consideration, for a stable operation of the detection circuits it is necessary that the voltage levels $l_2$ and $l_3$ be relatively invarient. From the above equations (1) and (2), it is seen that these levels are a function of the circuit's parasitic capacitance, which is included in the quantity $C_o$. The parasitic capacitance is composed of: stray capacitance, which is the capacitance between conductive areas on the touch panel and ground; input capacitance, which is the existing capacitance to ground at the input to the detection circuits; and lead capacitance, which is the capacitance between any two wire conductors connected to the touch panel or between wire conductors and ground. The stray capacitance and input capacitance are relatively fixed for a given capacitive touch panel design. However, the lead capacitance will tend to change in value as the wire routing is changed. Such change in lead capacitance plus the proximity of an operator to the switch array may introduce instability in the values of $Vl_2$ and $Vl_3$ so as to result in possible spurious actuation of one or more switch cells. This problem is overcome in the present invention by the connection of discrete capacitors at the input to the detection circuits, i.e., capacitors 16 and 18 as shown in FIG. 4. These capacitors are sufficiently large in value relative to any possible variations in the parasitic capacitance so as to substantially mask such variations by reducing the ratio of the variable component of the parasitic capacitance to the sum of the fixed component of the parasitic capacitance and the discrete capacitance.

Figure 7:
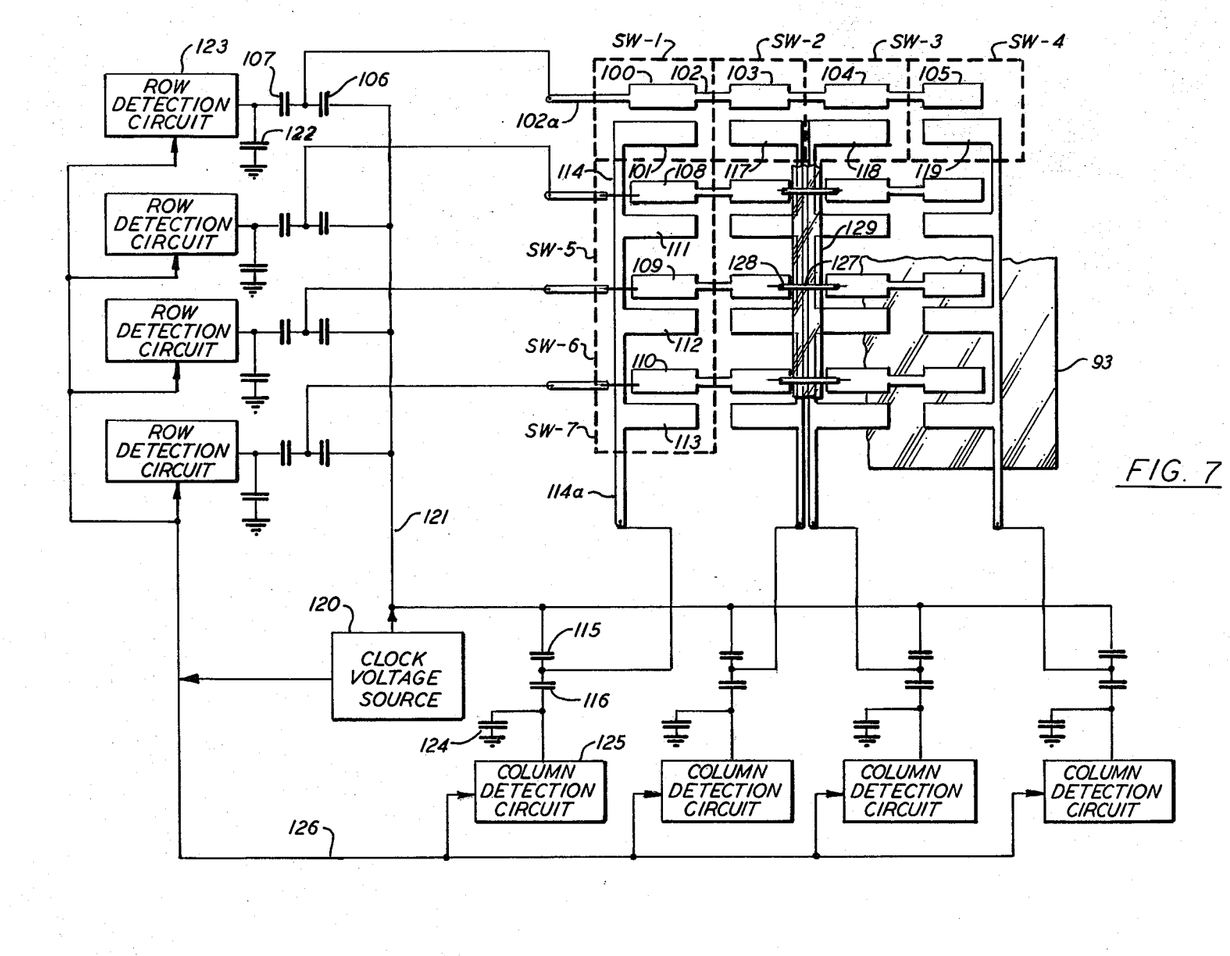
FIG. 7 is a plan view of the capacitor touch plates and an electrical schematic circuit and block diagram of the capacitor and peripheral circuitry of a capacitor touch switch array constructed in accordance with a second embodiment of the invention.

In FIG. 7 there is illustrated a capacitive touch switch array constructed in accordance with a second embodiment of the invention in which the row and column series capacitor pairs of the array's switch cells are combined into an electrical circuit that can be located off the touch panel and may be part of the detection circuitry, and the switch cells' touch means are integrally constructed on the touch panel. By virtue of this structure arrangement, the geometry and size of the touch means is made independent of the capacitance requirements. Thus, the touch panel in this embodiment consists of only a substrate 93, a portion of which is shown, overlaid with touch plates and their associated interconnections and terminations. In a transparent structure, the substrate 93 may be of glass and the touch plates of a transparent conductive material such as indium tin oxide. A single series capacitor pair and detection circuit is provided for each row and for each column of switch cells. As with respect to the first embodiment, for ease of illustration only a four by four matrix of switch cells are included in the array of FIG. 7, of which only cells SW-1 through SW-7 are identified.

Each switch cell includes on the touch panel a row touch plate and a column touch plate, shown as plates 100 and 101, respectively, of switch cell SW-1. Row touch plate 100 is connected to corresponding row touch plates 103, 104, and 105 of the other first row switch cells SW-2, SW-3 and SW-4, respectively, by conductors 102, and to the junction of the first row series capacitor pair 106 and 107 by terminal conductor 102a. Similarly, the row touch plates 108, 109 and 110 of first column switch cells SW-5, SW-6 and SW-7, respectively, are connected to the row touch plates of switch cells in their respective rows and to the junction of the remaining row series capacitor pairs. Column touch plate 101 is connected to corresponding column touch plate 111, 112 and 113 of the other first column switch cells SW-5, SW-6 and SW-7, respectively, by conductors 114 and to the junction of the first column series capacitor pair 115 and 116 by terminal conductor 114a. Similarly, the column touch plates 117, 118 and 119 of first row switch cells SW-2, SW-3 and SW-4, respectively, are connected to the column touch plates of switch cells in their respective columns and to the junctions of the remaining column series capacitor pairs. Where cross over conductors are required, such as at the intersection 127, the top conductor strip 128 may be a conductive epoxy overlaying a dielectric strip 129, which may be a polyester, polyeurethane or nonconductive epoxy, as previously considered with respect to the crossover conductors in FIG. 3A. For a transparent structure the dielectric strip may be, typically, a transparent polymide or silicon nitride and the top conductor strip may be, typically, indium tin oxide.

A clock voltage source 120 is connected by bus line 121 to input capacitors 106 and 115 of the first row and column capacitor pairs and to the input capacitors of the remaining row and column capacitor pairs. The output capacitor 107 of the first row capacitor pair is connected through capacitor 122 to ground and to the input of first row detection circuit 123. Similar connections are made between the output capacitors of the remaining row capacitor pairs and their respective row detection circuits. The output capacitor 116 of the first column capacitor pair is connected through capacitor 124 to ground and to the input of first column detection circuit 125. Similar connections are made between the output capacitors of the remaining column capacitor pairs and their respective column detection circuits. Clock voltage source 120 is further shown connected by line 126 to each of the row and column detection circuits for providing a sequential operation of these circuits.

The operation of the capacitor touch switch array of FIG. 7 is comparable to that previously described with respect to the first embodiment of the invention. Thus, for a non-actuated state of the switch cells, pulses of voltage level $l_1$ from clock source 120 are applied to each row and column capacitive voltage divider circuits, such as that of capacitors 106, 107, and 122 of switch cells SW-1 through SW-4 and that of capacitors 115, 116 and 124 of switch cells SW-1, SW-5, SW-6 and SW-7, which reduce the pulses to voltage level $l_2$ for detection by each of the row and column detection circuits. The row and column detection circuit provide outputs in sequential manner under the control of the clock pulses. Upon actuation of a single switch cell by the concurrent touching of its row and column touch plates, the voltage at the row and column detection circuits of the selected cell is reduced to level $l_3$. For example, when switch cell SW-1 is actuated by touching touch plates 100 and 101, the voltage applied to row detection circuit 123 and column detection circuit 125 is reduced to voltage level $l_3$. Outputs from detection circuits 123 and 125 thereby provide a coordinate identification of swith cell SW-1.

Significant advantages accrue to having the capacitor circuitry off the touch panel. The parameters of the capacitor circuitry can be chosen for optimum circuit performance completely independent of the switch cell physical dimensions. Correspondingly, the touch plates can be dimensioned essentially without restriction and may be made as small as desirable completely independent of the electrical properties of the circuit. In addition, the touch panel is of a much simpler construction, with conductive material on only one side of the substrate and requiring no capacitive elements as an integral part of the panel.

Figure 8A:
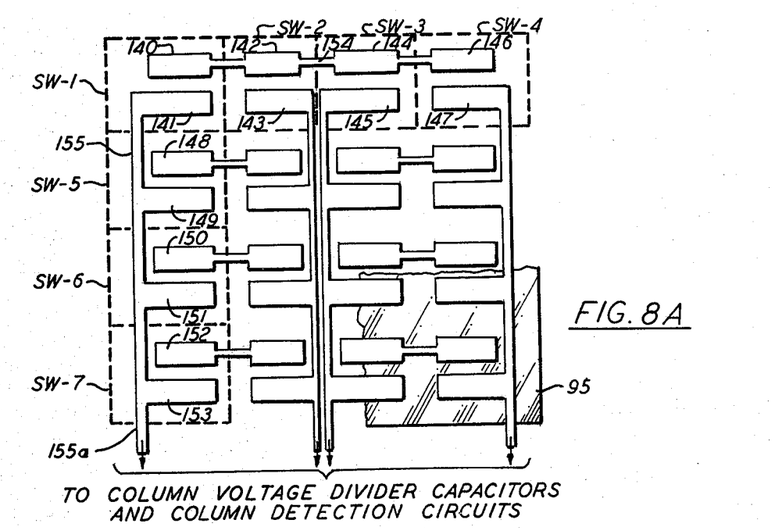
FIG. 8A is a plan view of the capacitor touch plates on the front side of a capacitor touch switch array constructed in accordance with a third embodiment of the invention.
Figure 8B:
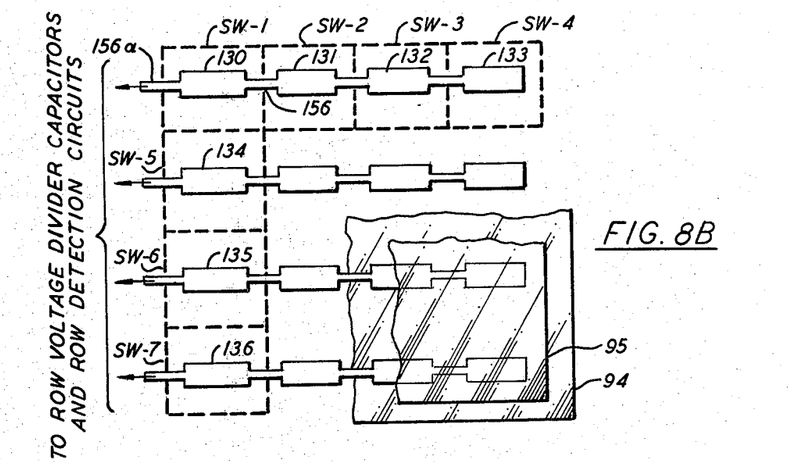
FIG. 8B is a plan view of the capacitor plates on the under side of the third embodiment touch switch array.

A third embodiment of the invention is illustrated in FIGS. 8A and 8B, which is a capacitive touch switch array having the capacitor voltage divider circuitry also off the touch panel as in the second embodiment. The panel is constructed with a conductor electrode configuration that does not require any conductor cross overs. Elimination of conductor cross overs removes the inherent disadvantages associated with such design and substantially simplifies and improves panel fabrication. It is noted that as in the previous embodiments, for ease of illustration only a four by four matrix of switch cells is illustrated, of which cells SW-1 through SW-7 are identified. FIG. 8A is a plan view of the array's touch plates formed on the front side of the touch panel, and FIG. 8B is a plan view, as viewed from the front side, of the underlaying capacitor plates. The touch panel is typically constructed to include a substrate 94, only a portion of which is shown, which may be of glass or other transparent dielectric material having deposited on one side with a transparent conductive material, such as indium tin oxide, forming a pattern of the capacitor plates, as shown by plates 130 through 136 of switch cells SW-1 through SW-7 in FIG. 8B. Overlaying this pattern is a sheet of transparent dielectric material 95, only a portion of which is shown, such as a transparent polymide or silicon nitride, which is in turn overlaid with a second coating of transparent conductive material forming a pattern of row and column touch plates, as shown by plates 140 through 153 of switch cells SW-1 through SW-7 in FIG. 8A. The touch panel is constructed so that the row touch plates in FIG. 8A are aligned directly over the capacitor plates in FIG. 8B, such as touch plates 140, 142, 144 and 146 in the first row switch cells SW-1 through SW-4 being aligned over capacitor plates 130 through 133. This construction provides a capacitive coupling between the touch capacitance and the capacitive voltage divider circuitry so as to eliminate the necessity of crossover conductors, as will be more clearly seen from further consideration of the structure and operation of FIGS. 8A and 8B and the electrical equivalent circuit of a single switch cell in this array shown in FIG. 9.

Referring to FIG. 8A, row touch plates 140, 142, 144 and 146 in the first row switch cells are connected together by conductors 154. The remaining row touch plates, such as plates 148, 150 and 152 of switch cells SW-5, SW-6 and SW-7 and the corresponding plates of switch cells in their respective rows, are connected together in pairs. Whereas it is not necessary that the row touch plates be joined for a proper operation of the circuit, joining them does increase the capacitive coupling between the touch capacitance and the voltage divider circuitry, and in the construction they are preferably joined where this can be accomplished without requiring crossover conductors. Column touch plates 141, 149, 151 and 153 are connected together by a conductor 155 and to the first column capacitor voltage divider and detection circuit by a terminal conductor 155a. Similarly, column touch plates 143, 145 and 147 of switch cells SW-2, SW-3 and SW-4, respectively, are connected to corresponding touch plates of switch cells in their respective columns and to the remaining column capacitor voltage divider and detection circuits. The column and row voltage divider and detection circuitry may be constructed and operated exactly as shown and described with respect to the second embodiment touch switch array of FIG. 7, and therefore this circuitry need not be shown further in FIGS. 8A and 8B.

Referring to FIG. 8B, capacitor plates 130 through 133 of the first row switch cells are connected together by conductor 156 and to the first row capacitor voltage divider and detection circuit by a terminal conductor 156a. Similarly, capacitor plates 134, 135, and 136 of switch cells SW-5, SW-6 and SW-7, respectively, are connected to corresponding capacitor plates of switch cells in their respective rows and to the remaining capacitive voltage divider and detection circuitry.

Figure 9:
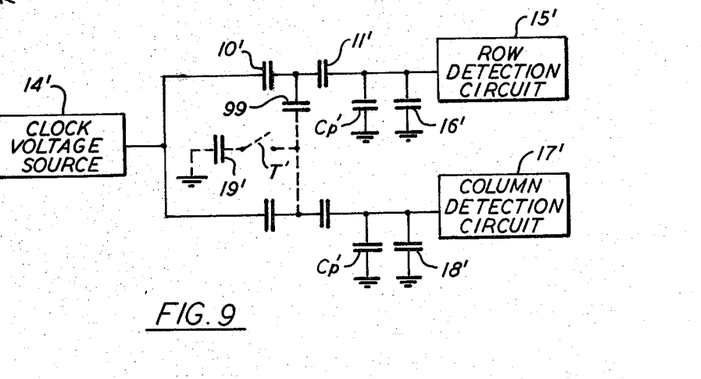
FIG. 9 is an electrical equivalent circuit of a single switch cell contained in the third embodiment of the invention.

The electrical equivalent circuit of a single switch cell contained in the touch switch array of FIGS. 8A and 8B is illustrated in FIG. 9, which with one principal exception is seen to be similar to the equivalent circuit of FIG. 4. Components in FIG. 9 that are similar to those in FIG. 4 are identified with the same reference character and an added prime notation. In FIG. 9, a coupling capacitor 99 is connected between the switch T' and the junction of series capacitors 10' and 11'. Coupling capacitor 99 represents the added coupling capacitance formed by the row touch plates in FIG. 8A, the capacitor plates in FIG. 8B and the dielectric layer 95 separating them. If it is assumed that the illustrated switch cell corresponds to cell SW-1 in FIGS. 8A and 8B, then capacitor 99 would be formed between plates 130 and 140.

In the operation of touch switch array of FIGS. 8A and 8B, in the non-actuated state of the switch cells a pulse waveform of voltage level $l_2$ is coupled to the row and column detection circuitry, as described with respect to the previously considered embodiments. When a selected switch cell is actuated by the concurrent touching of the cell's two touch plates, such as touch plates 140 and 141 of switch cell SW-1, the pulse waveform coupled to the column detection circuitry is reduced to voltage level $l_3$, as previously considered. In this case, the voltage divider circuit for the pulses coupled to the row detection circuitry includes the added coupling capacitance 99, which is assigned a value such that the pulse waveform coupled to the row detection circuitry is reduced to a voltage level that is slightly greater than $l_3$ and substantially less than voltage level $l_2$, which value is also substantially greater than that of a single series capacitor, typically 50 to 1000 pf.

In a typical construction of a totally transparent structure for the embodiment of FIGS. 8A and 8B, a glass substrate 94 about 0.060 inches in thickness is employed, overlaid with transparent indium tin oxide capacitor plates. The transparent dielectric material 95 is a silicon nitride layer about 6,000 to 10,000 Angstroms thick which is overlaid with transparent indium tin oxide touch plates. A nonconductive protective overcoat such as of silicon nitride or silicon dioxide thin enough not to affect operation of the switch array, for example, 200 to 500 Angstroms thick, may be employed to provide added protection to the touch plates and help reduce reflections. The connecting conductor runs are made sufficiently narrow so as to minimize stray capacitance between conductors, being typically, on the order of three mils. Furthermore, in this embodiment the effective value of the stray capacitance at the input of the detection circuits is substantially reduced by the additional capacitive coupling of capacitor 99. The touch plates and capacitor plates are dimensioned so as to be placed on one quarter inch centers in this example.

Although the invention has been described with respect to several specific embodiments thereof for the purpose of clear and complete disclosure, it is not intended that the invention be thus limited. Accordingly, it may be appreciated that many well known solid state materials and processing techniques other than those specifically disclosed can be employed for fabricating a totally or substantially transparent touch panel structure, without exceeding the basic teaching of the invention. In addition, while the invention has particular advantage when the touch panels are fabricated as totally or substantially transparent structures for direct interaction with a display, the present capacitive switch arrays may be extremely useful when constructed as opaque structures physically removed from the display, where their function may be limited to entering information into data processing equipment. Further, although the capacitive touch switch array embodiments described herein are in a regular column and row configuration, which is considered perhaps the most useful, the touch switch elements of the array can be arranged in other forms in accordance with the present teaching, such as in a radial configuration or in various irregular configurations. The appended claims are therefore to be construed as embodying modifications such as these, as well as all modifications and variations that may occur to ones skilled in the art which fall within the true scope and spirit of the invention.

What we claim as new and desire to secure by Letters Patent of the United States is:

1. A capacitive touch switch array, comprising:
   (a) an array of touch sensitive switch cells each including a first pair of series capacitors and a second pair of series capacitors,
   (b) a signal source coupled to said first and second pair of series capacitors,
   (c) first signal detection circuit means, said first pair of series capacitors coupling the signal from said signal source to said first signal detection circuit means,
   (d) second signal detection circuit means, said second pair of series capacitors coupling the signal from said signal source to said second signal detection circuit means, and
   (e) touch means associated with each switch cell for providing capacitive coupling of the junctions of each pair of series capacitors of a selected switch cell to ground for actuating said selected switch cell and varying the signal coupled by the first and second pair of series capacitors of said selected switch cell to said first and second signal detection circuits means.

2. A capacitive touch switch array as in claim 1 wherein the switch cells of said array are arranged in first and second groups that define a system of coordinates for specifying the location of each switch cell within said array, said first signal detection circuit means includes a first plurality of detection circuits and said second signal detection circuit means includes a second plurality of detection circuits, the first pairs of series capacitors in said switch cells are each connected to corresponding detection circuits within said first plurality of detection circuits in accordance with parameters of said system of coordinates established by said first groups of switch cells with each said first pair of series capacitors in said first group of said switch cells having the same address in the system of coordinates being connected to the same said detection circuit, and the second pairs of series capacitors in said switch cells are each connected to corresponding detection circuits within said second plurality of detection circuits in accordance with parameters of said system of coordinates established by said second groups of switch cells with each said second pair of series capacitors in said second group of said switch cells having the same address in the system of coordinates being connected to the same said detection circuit.

3. A capacitive touch switch array as in claim 2 wherein said signal source generates a signal that is commonly applied to each of the switch cells of said array.

4. A capacitive touch switch array as in claim 3 wherein said array further comprises means for addressing said first and second plurality of detection circuits in a predetermined manner for generating therefrom an output in accordance with the state of the detection circuits addressed.

5. A capacitive touch switch array as in claim 2 wherein said first and second pair of series capacitors and said touch means of each switch cell are integrally constructed in the form of a touch panel, said first pair of series capacitors of switch cells within each group of said first groups of switch cells are connected in parallel, and said second pair of series capacitors of switch cells within each group of said second groups of switch cells are connected in parallel, whereby the effective series capacitance of said first pair of series capacitors of each switch cell and the effective series capacitance of said second pair of series capacitors of each switch cell, respectively, are increased over that of an individually connected first and second pair of series capacitors by a multiple substantially equal to the number of switch cells within each group.

6. A capacitive touch switch array as in claim 5 wherein said touch panel comprises a dielectric layer having a first pattern of capacitor touch plates on one surface thereof and a second pattern of input capacitor plate means and output capacitor plates on an opposing surface thereof, each of said switch cells including first and second capacitor touch plates, input capacitor plate means coupled to said signal source, a first output capacitor plate coupled to said first plurality of detection circuits and a second output capacitor plate coupled to said second plurality of detection circuits, said first pair of capacitors of each switch cell being formed between said input capacitor plate means, a first capacitor touch plate and a first output capacitor plate, respectively, and said second pair of series capacitors of each switch cell being formed between said input capacitor plate means, a second capacitor touch plate and a second output capacitor plate, respectively.

7. A capacitive touch switch array as in claim 6 wherein said input capacitor plate means comprise a plurality of input capacitor plates that are each common to the first and second pair of series capacitors of at least a single switch cell.

8. A capacitive touch switch array as in claim 7 wherein said first groups of switch cells are rows, said second groups of switch cells are columns, said first plurality of detection circuits includes a row detection circuit corresponding to each row of switch cells and said second plurality of detection circuits includes a column detection circuit corresponding to each column of switch cells, within each row of switch cells said first capacitor touch plates being coupled together and said first output capacitor plates being coupled together and to a corresponding row detection circuit, within each column of switch cells said second capacitor touch plates being coupled together and said second output capacitor plates being coupled together and to a corresponding column detection circuit, and said input capacitor plates being coupled together within the entire array of switch cells.

9. A capacitive touch switch array as in claim 8 wherein said signal source generates a signal that is commonly applied to each input capacitor plate of the switch cells of said array.

10. A capacitive touch switch array as in claim 9 wherein said array further comprises means for scanning said first and second plurality of detection circuits for generating therefrom a sequential output.

11. A capacitive touch switch array as in claim 2 wherein said touch means of each switch cell comprise first and second touch elements that are integrally constructed in the form of a touch panel and said first and second pair of series capacitors are in an electrical circuit separate from said touch panel, said electrical circuit including a first pair of series capacitors corresponding to each group of said first groups of switch cells and to each detection circuit of said first plurality of detection circuits, and a second pair of series capacitors corresponding to each group of said second groups of switch cells and to each detection circuit of said second plurality of detection circuits, said first touch elements of switch cells in each group of said first groups of switch cells being coupled together and to the junctions of corresponding first pairs of series capacitors, and said second touch elements of switch cells in each group of said second groups of switch cells being coupled together and to the junctions of corresponding second pairs of series capacitors.

12. A capacitive touch switch array as in claim 11 wherein said signal source generates a signal that is commonly applied to the inputs of each of said first and second pair of series capacitors, the outputs of each of said first and second pair of series capacitors being coupled to their corresponding detection circuits.

13. A capacitive touch switch array as in claim 12 wherein said array further comprises means for scanning said first and second plurality of detection circuits for generating therefrom a sequential output.

14. A capacitive touch switch array as in claim 11 which includes a plurality of coupling capacitors integrally constructed on said touch panel and serving to couple said first touch elements of switch cells in each group of said first groups of switch cells to the junctions of corresponding first pairs of series capacitors.

15. A capacitive touch switch array as in claim 14 wherein said touch panel comprises a dielectric layer having a first pattern of said first and second touch elements on one surface thereof and a second pattern of capacitor plates on an opposing surface thereof, each of said switch cells further including a capacitor plate, said coupling capacitors being formed between said capacitor plates and said first touch elements.

16. A capacitive touch switch array as in claim 15 wherein said first groups of switch cells are rows, said second groups of switch cells are columns, said second touch elements within each column are coupled together and said capacitor plates within each row are coupled together.

17. A capacitor touch panel including an array of touch sensitive switch cells, said touch panel comprising:
(a) a dielectric layer,
(b) a first pattern of capacitor touch plates on one surface of said dielectric layer, each of said switch cells including first and second capacitor touch plates responsive to touch,
(c) a second pattern of input and output capacitor plates on the opposing surface of said dielectric layer, each of said switch cells further including an input capacitor plate responsive to an input signal source, a first output capacitor plate providing a first output signal and a second output capacitor plate providing a second output signal,
(d) a first pair of series capacitors for each switch cell being formed between said input capacitor plate, a first capacitor touch plate and a first output capacitor plate, respectively, and
(e) a second pair of series capacitors for each switch cell being formed between said input capacitor plate, a second capacitor touch plate and a second output capacitor plate, respectively.

18. A capacitive touch panel as in claim 17 wherein said switch cells are arranged in rows and columns, within each row of switch cells said first capacitor touch plates being coupled together and said first output capacitor plates being coupled together, within each column of switch cells said second capacitor touch plates being coupled together and said second output capacitor plates being coupled together, and said input capacitor plates being coupled together within the entire array of switch cells.

19. A panel including an array of cells arranged in first and second groups that define a system of coordinates for specifying the location of each cell within said array, which cells are individually accessible to external circuitry without a requirement for crossover conductors on said panel, comprising:
(a) a dielectric layer,
(b) a first pattern of first and second electrodes on one surface of said dielectric layer,
(c) a second pattern of third electrodes on an opposing surface of said dielectric layer, each of said cells including a first, second and third electrode, said first and third electrodes being capacitively coupled together through said dielectric layer,
(d) means for coupling said second electrodes together within each group of said second groups of cells and for providing first access means to said external circuitry, and (e) means for coupling said third electrodes together within each group of said first groups of cells and for providing second access means to said external circuitry.

20. A panel as in claim 19 which includes means for coupling said first electrodes together at least in pairs within each group of said first groups of cells.

21. A capacitive touch switch array, comprising:
(a) an array of touch sensitive switch cells each including at least a pair of series capacitors,
(b) a signal source coupled to said pair of series capacitors,
(c) a signal detection circuit means having parasitic capacitance present between the input of said signal detection circuit means and ground, said parasitic capacitance having a fixed and a variable component,
(d) a discrete capacitor coupled between the input of said signal detection circuit means and ground in parallel with said parasitic capacitance, said discrete capacitor having a value of capacitance large enough to substantially mask the variable component of said parasitic capacitance,
(e) coupling means including said pair of series capacitors and said discrete capacitor for coupling the signal from said signal source to said signal detection circuit means as a voltage divided signal of a first voltage level, and
(f) touch means associated with each switch cell for providing capacitive coupling of the junction of each pair of series capacitors of a selected switch cell to ground for actuating said selected switch cell and further voltage dividing the signal coupled to said signal detection circuit means to a second voltage level, said discrete capacitor serving to stabilize said first and second voltage levels.

22. A capacitive touch switch array, comprising:
(a) an array of touch sensitive switch cells each including a first pair of series capacitors and a second pair of series capacitors,
(b) a signal source coupled to said first and second pair of series capacitors,
(c) first signal detection circuit means having parasitic capacitance between the input of said first signal detection circuit means and ground, said parasitic capacitance having a fixed and a variable component,
(d) a first discrete capacitor coupled between the input of said first signal detection circuit means and ground in parallel with said parasitic capacitance, said first discrete capacitor having a value of capacitance large enough to substantially mask the variable component of said parasitic capacitance,
(e) first coupling means including said first pair of series capacitors and said first discrete capacitor for coupling the signal source to the input of said first signal detection circuit means as a voltage divided signal of a first voltage level,
(f) second signal detection circuit means having said parasitic capacitance between the input of said second signal detection circuit means and ground,
(g) a second discrete capacitor coupled between the input of said second signal detection circuit means and ground in parallel with said parasitic capacitance, said second discrete capacitor having a value of capacitance large enough to substantially mask the variable component of said parasitic capacitance,
(h) second coupling means including said second pair of series capacitors and said second discrete capacitor for coupling the signal from said signal source to the input of said second signal detection circuit means as a voltage divided signal of said first voltage level, and
(i) touch means associated with each switch cell for providing capacitive coupling of the junctions of each pair of series capacitors of selected switch cell to ground for actuating said selected switch cell and further voltage dividing the signal coupled to said first and second signal detection means to a second voltage level, said first and second discrete capacitors serving to stabilize said first and second voltage levels.

* * * * *